United States Patent
Lloyd et al.

(10) Patent No.: US 9,731,961 B2
(45) Date of Patent: Aug. 15, 2017

(54) MEMS-CMOS-MEMS PLATFORM

(71) Applicant: InvenSense, Inc., San Jose, CA (US)

(72) Inventors: Stephen Lloyd, Los Altos, CA (US); Ilya Gurin, Mountain View, CA (US)

(73) Assignee: InvenSense, Inc., San Jose, CA (US)

( * ) Notice: Subject to any disclaimer, the term of this patent is extended or adjusted under 35 U.S.C. 154(b) by 0 days.

(21) Appl. No.: 14/797,013

(22) Filed: Jul. 10, 2015

(65) Prior Publication Data

US 2017/0008760 A1 Jan. 12, 2017

(51) Int. Cl.
*B81B 7/00* (2006.01)

(52) U.S. Cl.
CPC .... *B81B 7/0074* (2013.01); *B81B 2203/0315* (2013.01); *B81B 2207/012* (2013.01); *B81B 2207/07* (2013.01)

(58) Field of Classification Search
CPC .............................. B81B 7/0074; B81B 7/0032
See application file for complete search history.

(56) References Cited

U.S. PATENT DOCUMENTS

| | | | |
|---|---|---|---|
| 8,936,959 B1 | 1/2015 | Yang | |
| 9,327,964 B2 * | 5/2016 | Allegato | B81B 7/0074 |
| 9,400,288 B2 | 7/2016 | Feyh et al. | |
| 9,567,207 B2 * | 2/2017 | Tseng | B81B 7/02 |
| 2004/0227201 A1 | 11/2004 | Borwick, III et al. | |
| 2015/0028432 A1 | 1/2015 | Kim et al. | |
| 2015/0108653 A1 * | 4/2015 | Hooper | B81B 7/007 257/774 |
| 2015/0251903 A1 * | 9/2015 | Bowles | H01L 25/50 257/415 |
| 2016/0046483 A1 * | 2/2016 | Cheng | B81B 7/008 257/692 |
| 2016/0137492 A1 | 5/2016 | Cheng et al. | |
| 2016/0362293 A1 | 12/2016 | Smeys et al. | |

OTHER PUBLICATIONS

Choa, S.H. "Reliability of vacuum packaged MEMS gyroscopes" Microelectronics Reliability vol. 45, Iss. 2 Feb. 2005 pp. 361-369.*
Qu, H. "Process Development for CMOS-MEMS Sensors with Robust Electrically Isolated Bulk Silicon Microstructures" Jour. of Micro. Sys. vol. 16, No. 5 Oct. 2007 pp. 1152-1161.*

(Continued)

*Primary Examiner* — Matthew Landau
*Assistant Examiner* — Grant Withers

(57) ABSTRACT

A package combining a MEMS substrate, a CMOS substrate and another MEMS substrate in one package that is vertically stacked is disclosed. The package comprises a sensor chip further comprising a first MEMS substrate and a CMOS substrate with a first surface and a second surface and where the first MEMS substrate is attached to the first surface of the CMOS substrate. The package further includes a second MEMS substrate with a first surface and a second surface, where the first surface of the second MEMS substrate is attached to the second surface of the CMOS substrate and the second surface of the second MEMS substrate is attached to a packaging substrate. The first MEMS substrate, the CMOS substrate, the second MEMS substrate and the packaging substrate are provided with electrical inter-connects.

21 Claims, 6 Drawing Sheets

(56) References Cited

OTHER PUBLICATIONS

MEMS Investor Journal Interview ("Through Substrate Vias: Opportunities for CMOS MEMS and 3D Integration" Article available online at http://www.memsjournal.com/ 2012/02/through-substrate-vias-opportunities-for-cmos-mems-and-3d-integration.html as of Mar. 17, 2012.*
Sood, S. "Al—Ge Eutectic Wafer Bonding and Bond Characterization for CMOS Compatible Wafer Packaging" 218th Electrochemical Society Meeting held Oct. 15, 2010 copyright 2010 pp. 1.*
Xie, H. "Fabrication, Characterization, and Analysis of a DRIE CMOS-MEMS Gyroscope" IEEE Sensors Journal vol. 3, No. 5 Oct. 2003 pp. 622-631.*

* cited by examiner

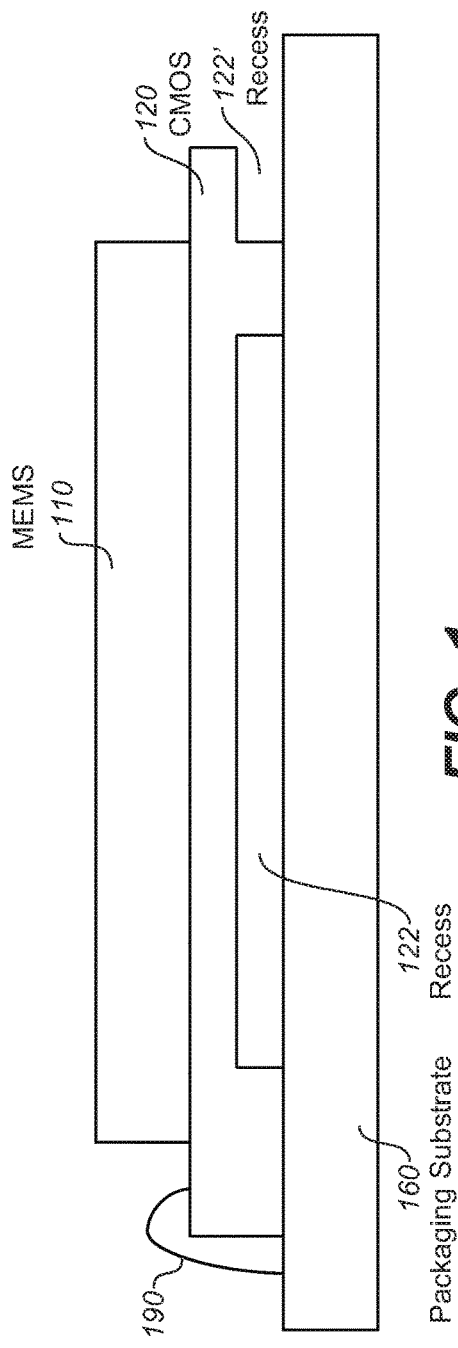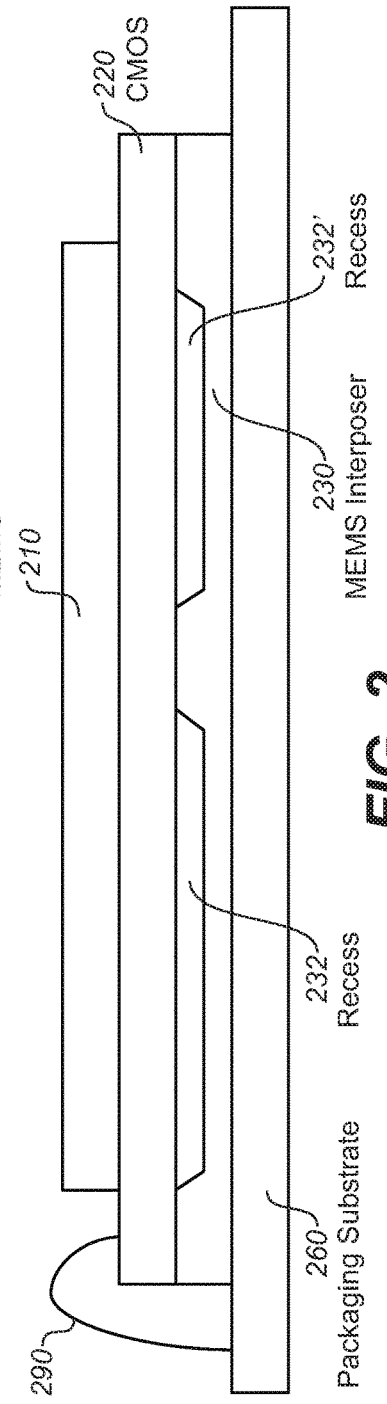

MEMS-CMOS-MEMS PLATFORM

FIELD OF THE INVENTION

The present invention relates generally to micro-electromechanical systems (MEMS) devices, and more particularly to the package containing MEMS substrate integrated with a CMOS substrate.

BACKGROUND OF THE INVENTION

As more and more applications reside on MEMS it will be useful to have two different MEMS for different MEMS processes connected to a CMOS to provide electronic circuits. This is particularly useful where the two different MEMS processes may require different environments to function efficiently. For example, pressure sensors, chemical sensors, sound sensors and the like may need access to the ambient environment; as opposed to accelerometers and gyroscopes, which need hermetically sealed chambers since they require specific pressure for optimal performance. Combining a MEMS, a CMOS and another MEMS in one package that is vertically stacked results in a smaller package with reduced requirements for board area or "real estate."

Controlling stress in the MEMS is another issue that needs to be addressed. Stress/strain in the substrate on which a sensor is mounted or integrated causes the performance of the sensor to change.

Accordingly, it is desired to have a device that addresses the requirements of two different MEMS for different MEMS processes in a single package as well as stress isolation. The present invention addresses such a need.

SUMMARY

A package combining a MEMS substrate, a CMOS substrate and another MEMS substrate in one package that is vertically stacked is disclosed. The package comprises a sensor chip further comprising a first MEMS substrate, a CMOS substrate, and a second MEMS substrate. The CMOS substrate has a first surface and a second surface, where the first MEMS substrate is attached to the first surface of the CMOS substrate. The second MEMS substrate has a first surface and a second surface, where the first surface of the second MEMS substrate is attached to the second surface of the CMOS substrate and the second surface of the second MEMS substrate is attached to a packaging substrate. The first MEMS substrate, the CMOS substrate, the second MEMS substrate and the packaging substrate are connected with electrical interconnects.

In another embodiment, a MEMS-CMOS package is disclosed. The package comprises a CMOS substrate and a MEMS substrate. The CMOS substrate has a first surface and a second surface, where the first surface of the CMOS substrate is mechanically connected to a packaging substrate and the second surface of the CMOS substrate is mechanically connected to the MEMS substrate. The MEMS substrate, the CMOS substrate and the packaging substrate are provided with electrical interconnects. The CMOS substrate further comprises at least one recess on the side attached to the packaging substrate.

BRIEF DESCRIPTION OF THE DRAWINGS

FIG. 1 illustrates a MEMS-CMOS package showing a stress-relieving recess according to an embodiment.

FIG. 2 illustrates a MEMS-CMOS-MEMS package with a MEMS interposer between a CMOS substrate and a packaging substrate in accordance with an embodiment.

DETAILED DESCRIPTION OF PREFERRED EMBODIMENTS

Figure 3A:
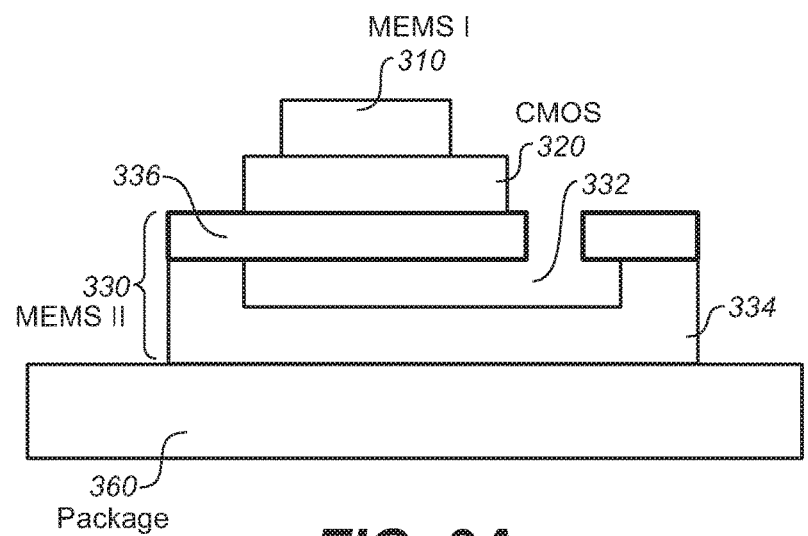
FIG. 3a illustrates a second MEMS-CMOS-MEMS package in accordance with an embodiment.

The present invention relates generally to micro-electromechanical systems (MEMS) devices, and more particularly to a package containing one or more MEMS substrates integrated with a CMOS substrate.

The following description is presented to enable one of ordinary skill in the art to make and use the invention and is provided in the context of a patent application and its requirements. Various modifications to the described embodiments and the generic principles and features described herein will be readily apparent to those skilled in the art. Thus, the present invention is not intended to be limited to the embodiments shown but is to be accorded the widest scope consistent with the principles and features described herein.

In the described embodiments Micro-Electro-Mechanical Systems (MEMS) refers to a class of structures or devices fabricated using semiconductor-like processes and exhibiting mechanical characteristics such as the ability to move or deform. MEMS often, but not always, interact with electrical signals. MEMS devices include but are not limited to gyroscopes, accelerometers, magnetometers, pressure sensors, microphones, and radio-frequency components.

A MEMS substrate may be a MEMS wafer or a MEMS die. Silicon wafers containing MEMS structures are referred to as MEMS wafers. Similarly, a CMOS substrate may be a CMOS wafer or a CMOS die. It should be understood that the CMOS substrate may comprise complementary metal-oxide semiconductor circuits or other types of circuits.

In the described embodiments, 'MEMS device' may refer to a semiconductor device implemented as a micro-electro-mechanical system. 'MEMS structure' may refer to any feature that may be part of a larger MEMS device. 'Engineered silicon-on-insulator (ESOI) substrate' may refer to a SOI substrate with cavities beneath the silicon device layer or substrate. 'Handle substrate' typically refers to a thicker substrate used as a carrier for the thinner silicon device substrate in a silicon-on-insulator substrate. 'Handle substrate' can be a handle wafer or a handle die and may also be referred to as a MEMS cover.

In the described embodiments, 'cavity' may refer to an opening or recess in a substrate wafer, and 'enclosure' may refer to a fully enclosed space. 'Bond chamber' may be an enclosure in a piece of bonding equipment where the wafer bonding process takes place. The atmosphere in the bond chamber determines the atmosphere sealed in the bonded wafers.

As more and more applications reside on MEMS it will be useful to have different MEMS devices for different MEMS processes connected to a single CMOS to provide electronic circuits. This is particularly useful where the different MEMS devices may require different environments to function efficiently. For example, pressure sensors, chemical sensors, acoustic sensors and the like may need access to the ambient environment, as opposed to accelerometers and gyroscopes that need hermetically sealed chambers since they require specific pressures and clean environments for optimal performance. Providing the ability to combine a MEMS substrate, a CMOS substrate and another MEMS substrate in one package that is vertically stacked results in a smaller package with reduced requirements for the commodity of space or "real estate."

In an embodiment, a MEMS substrate and a CMOS substrate can be electrically connected to each other and to a packaging substrate using some combination of wire bonds, through-silicon vias, solder bonding, or eutectic bonding. (For eutectic bonding, refer to U.S. Pat. No. 7,104,129 "Vertically Integrated MEMS Structure with Electronics in a Hermetically Sealed Cavity"). Additionally, if the MEMS substrate requires an electrical contact to the back side, it can be achieved with an additional wire bond, internal contacts, or a wedge cut. In an embodiment, bond wires and bond pads provide the electrical connections from either substrate to the packaging substrate. A last layer of metal deposited in the conventional CMOS metallization process is a metal layer suitable for use as a bond metal. In another embodiment, the electrical connections can be formed using through-silicon vias in CMOS as well as in MEMS substrate.

In an embodiment, a first MEMS substrate is mechanically connected to a CMOS die. The CMOS substrate is in turn mechanically connected to one side of a second MEMS substrate and a packaging substrate (package) is mechanically connected to the other side of the second MEMS substrate. Mechanical connections between the first MEMS substrate, CMOS substrate and second MEMS substrate can be provided by Si to $SiO_2$ fusion bonding, Si to Si fusion bonding, eutectic bonding, solder bonding or a low-stress adhesive material. The bond between a packaging substrate (package) and the second MEMS substrate can be hermetic, or it can be non-hermetic. The second MEMS substrate can be bonded to the packaging substrate using a low-stress adhesive material, such as die attach film (DAF), or Room-Temperature Vulcanizing (RTV) silicone elastomer which is commonly used for a pressure sensor. The packaging substrate may be a multi-layer packaging substrate such as a Land Grid Array (LGA).

In an embodiment, a bonded device substrate would comprise a CMOS substrate with a conductive layer such as an aluminum or copper top metallization layer, eutectically bonded to first and second MEMS substrates on either side of the CMOS substrate. An additional conductive layer on the back side of the CMOS substrate allows for electrical connections between the CMOS substrate and the second MEMS substrate. At least one of the MEMS substrate may comprise a handle substrate with etched cavities coated by a thin silicon oxide layer and fusion bonded to a silicon device layer. The device layer may be patterned so as to define the desired moveable or stationary structure.

In an embodiment, the conductive layer may comprise any electrically conductive metal or semiconductor. An opening is etched in the back of the CMOS substrate, stopping on one of the CMOS metallization layers. The CMOS metallization layer may be any one of the existing CMOS metallization layers. The sidewalls of the opening are then electrically passivated by depositing an insulating film (ex. silicon oxide, silicon nitride, polymer). Typically the insulating film will also be deposited on the bottom surface of the opening, covering the previously exposed CMOS metallization layer. The CMOS metallization layer is then once again exposed by an etching or saw dicing process such that the insulating film on the sidewalls of the opening is not removed. This etching or saw dicing process may expose the surface, edges, or both of the CMOS metallization layer. A conductive interconnection layer (typically a metal layer composed of Aluminum or Copper) is deposited onto the back surface of the CMOS substrate and into the passivated openings so as to create electrical contact to the CMOS metallization layer. The interconnection layer is then patterned so as to create individual isolated contacts. A polymer stress-relief layer can optionally be deposited on top of the interconnection layer to reduce stress on the silicon substrate caused by board-level assembly. The stress-relief layer is patterned so as to create vias to the interconnection layer. Then a conductive redistribution layer is deposited and patterned on top of the stress-relief layer. Finally, solder balls are defined on top of the redistribution layer to facilitate soldering the packaged substrate to a printed circuit board. Alternatively, one of the MEMS substrates can function as a stress-isolating platform (interposer) for the CMOS substrate and the first MEMS substrate. The sensitivity of MEMS to package stress is a matter of increasing concern, as packages become smaller and performance requirements more stringent.

In one embodiment, the interposer has cavities etched into the surface contacting the packaging substrate, in order to reduce the contact area and stress transmitted from the packaging substrate. In another embodiment, the interposer has cavities etched into the surface contacting the CMOS substrate, in order to reduce the contact area and stress transmitted to the CMOS substrate.

In yet another embodiment, a moving structure is formed in the interposer, and the CMOS is attached only to this moving structure. The moving structure can be a paddle, connected to the rest of the interposer at a single point, or a gimbal, connected to the rest of the interposer at two points.

FIG. 1 illustrates a MEMS-CMOS package 100 with recesses 122 and 122' etched into the CMOS substrate for stress-relieving purposes in accordance with an embodiment. The MEMS-CMOS package 100 contains a MEMS substrate 110 mechanically connected to a CMOS substrate 120, where electrical connections between the CMOS substrate 120 and packaging substrate 160 are provided by wire bonds 190 and bond pads (not shown). Also shown are the recesses 122 and 122' in the CMOS substrate 120 to provide stress isolation where CMOS pivots about two contact points.

FIG. 2 illustrates a MEMS-CMOS-MEMS package 200 with a MEMS interposer 230 for stress relieving purpose in accordance with an embodiment. The MEMS-CMOS-MEMS package 200 contains a MEMS substrate 210 mechanically connected to a CMOS substrate 220 which in turn is mechanically connected to another MEMS substrate, a MEMS interposer 230. The electrical connections are provided using a combination of wire bonds 290, bond pads, Through-Silicon Vias (TSVs), solder bonding, or eutectic bonding. The MEMS interposer 230 has recesses 232 and 232' between CMOS 220 and packaging substrate 260. The MEMS interposer 230 functions as a stress-isolating platform (interposer) for the CMOS 220 and the first MEMS 210. The MEMS interposer 230 can be a blank substrate providing stress relief or it can be patterned inactive silicon substrate. The MEMS interposer 230 in this embodiment has cavities or recesses 232 and 232' etched into the surface contacting the CMOS substrate 220, in order to reduce the contact area and stress transmitted to the CMOS substrate 220. In another embodiment, the interposer 230 may have cavities or recesses 232 and 232' etched into the surface contacting the packaging substrate 260, in order to reduce the contact area and stress transmitted from the packaging substrate 260. In another embodiment, the MEMS interposer 230 may contain CMOS circuits.

FIG. 3a illustrates a second MEMS-CMOS-MEMS package in accordance with an embodiment. In this embodiment, a second MEMS die or interposer MEMS II 330 comprises a moving structure 336 and a handle die 334. The CMOS die 320 is mechanically connected only to this moving structure 336 on one side and to another MEMS die, MEMS I 310 on the other side. The electrical connections are provided using a combination of wire bonds, TSVs, solder bonding, or eutectic bonding. The moving structure 336 as shown in this embodiment is a paddle, connected to the handle die 334 at a single point.

Figure 3B:
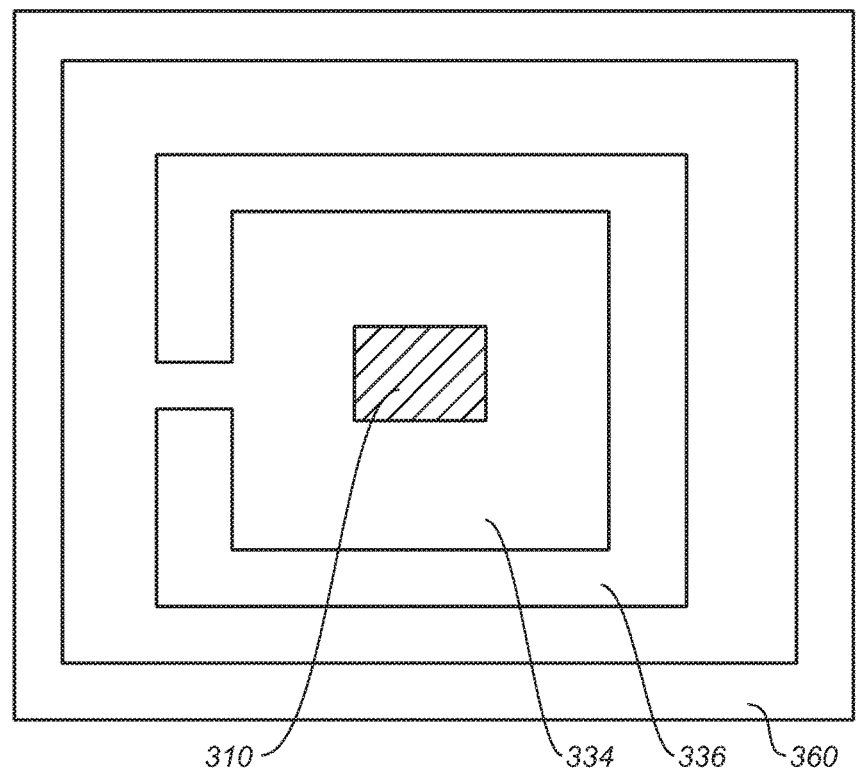
FIG. 3b illustrates a top view of the second MEMS-CMOS-MEMS package in accordance with an embodiment.

FIG. 3b illustrates a top view of the third MEMS-CMOS package with a MEMS die between CMOS and packaging substrate in accordance with an embodiment. In this embodiment, MEMS II 330 comprises a moving structure 336 and a handle die 334. The CMOS die 320 (not shown) is attached to this moving structure 336 on one side and to another MEMS die, MEMS I 310 on the other side, for example with an adhesive. The moving structure 336 as shown in this embodiment is a paddle, connected to the handle substrate 334 at a single point.

Figure 4A:
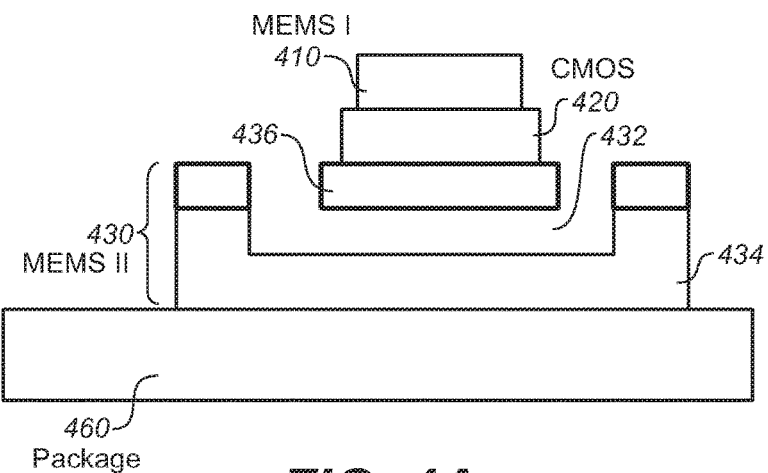
FIG. 4a illustrates a third MEMS-CMOS-MEMS package in accordance with an embodiment.

FIG. 4a illustrates a fourth MEMS-CMOS-MEMS package in accordance with an embodiment. In this embodiment, a second MEMS die or interposer, MEMS II 430 comprises a moving structure 436 and a handle die 434. The CMOS die 420 is mechanically connected only to this moving structure 436 on one side and to another MEMS die, MEMS I 410 on the other side. The electrical connections are provided using a combination of wire bonds, TSVs, solder bonding, or eutectic bonding. The moving structure 436 in this embodiment is a gimbal, connected to the handle die 434 at two points.

Figure 4B:
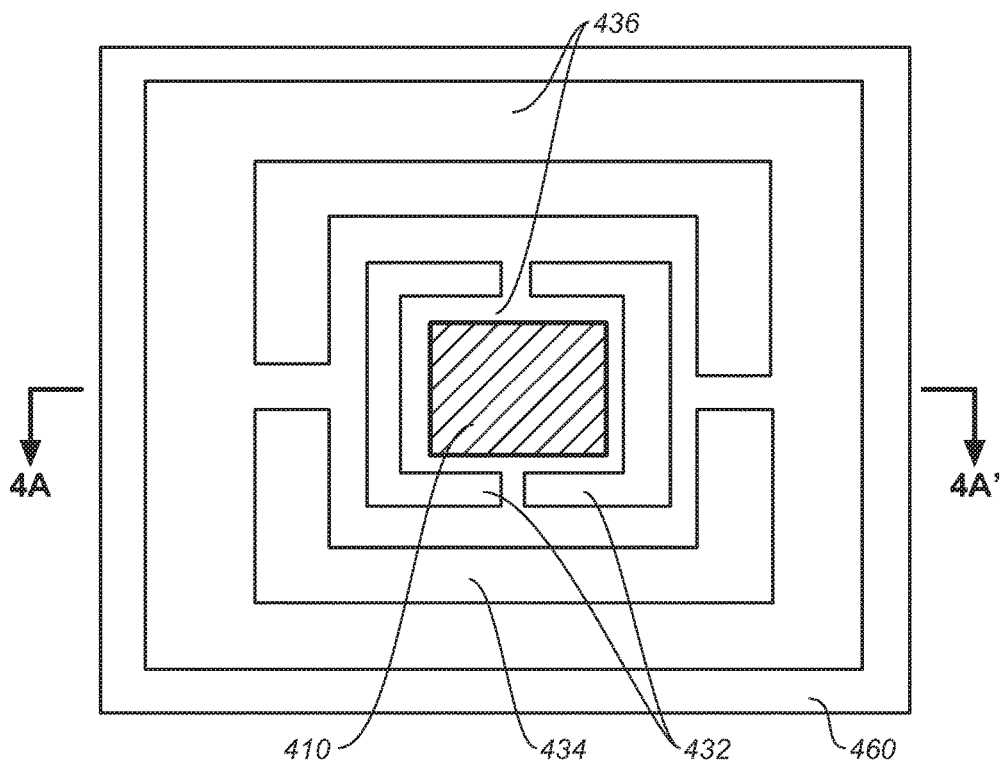
FIG. 4b illustrates a top view of the third MEMS-CMOS-MEMS package in accordance with the third embodiment.

FIG. 4b illustrates a top view of the fourth MEMS-CMOS package with a MEMS die between CMOS and packaging substrate in accordance with an embodiment. In this embodiment, MEMS II 430 comprises a moving structure 436 and a handle die 434. The CMOS die 420 (not shown) is attached to this moving structure 436 on one side and to another MEMS die, MEMS I 410 on the other side, for example with an adhesive. The moving structure 436 in this embodiment is a gimbal, connected to the handle substrate 434 at two points A and A'.

Figure 5A:
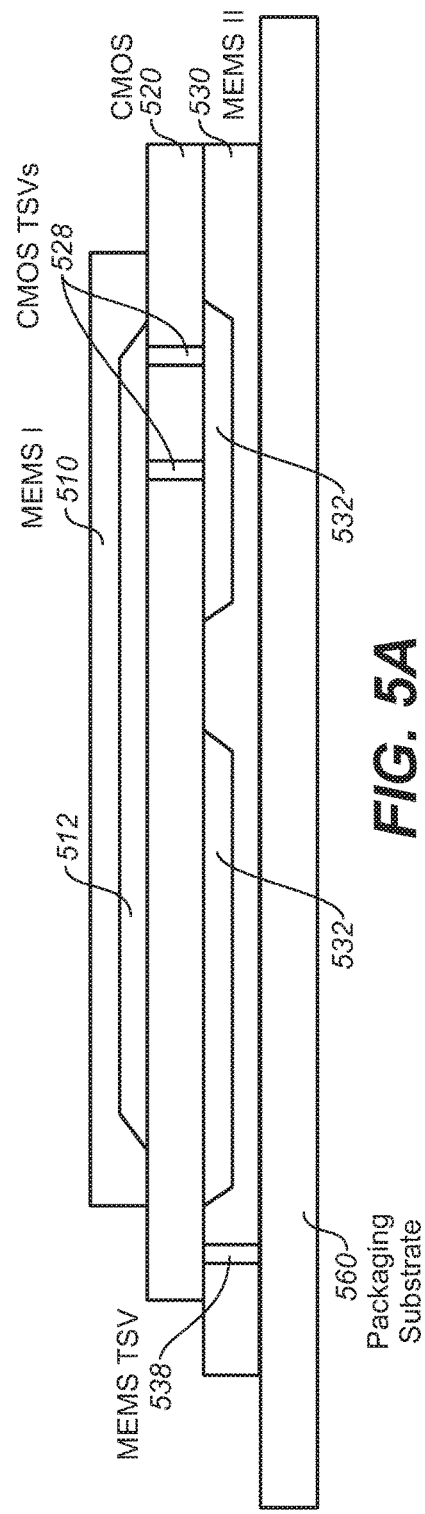
FIG. 5a illustrates a fourth MEMS-CMOS-MEMS package in accordance with an embodiment.

FIG. 5a illustrates a fifth MEMS-CMOS-MEMS package in accordance with an embodiment. The MEMS I 510, CMOS 520 and MEMS II 530 are electrically connected to each other and to the packaging substrate 560. In this embodiment as shown, the electrical connections are formed using through-silicon vias 528 in CMOS 520 and 538 in MEMS II 530. In another embodiment, the electrical connections are formed using a combination of MEMS TSVs, CMOS TSVs and solder bonding or eutectic bonding. The last layer of metal deposited in the conventional CMOS metallization process is suitable for use as a bond metal. The MEMS I and MEMS II may each contain MEMS sensors, including but not limited to accelerometers, gyroscopes, etc. The cavity 532, on the side of the MEMS II 530 facing the CMOS 520', which may contain MEMS sensors, also provides stress isolation between the MEMS II 530 and the CMOS 520.

Figure 5B:
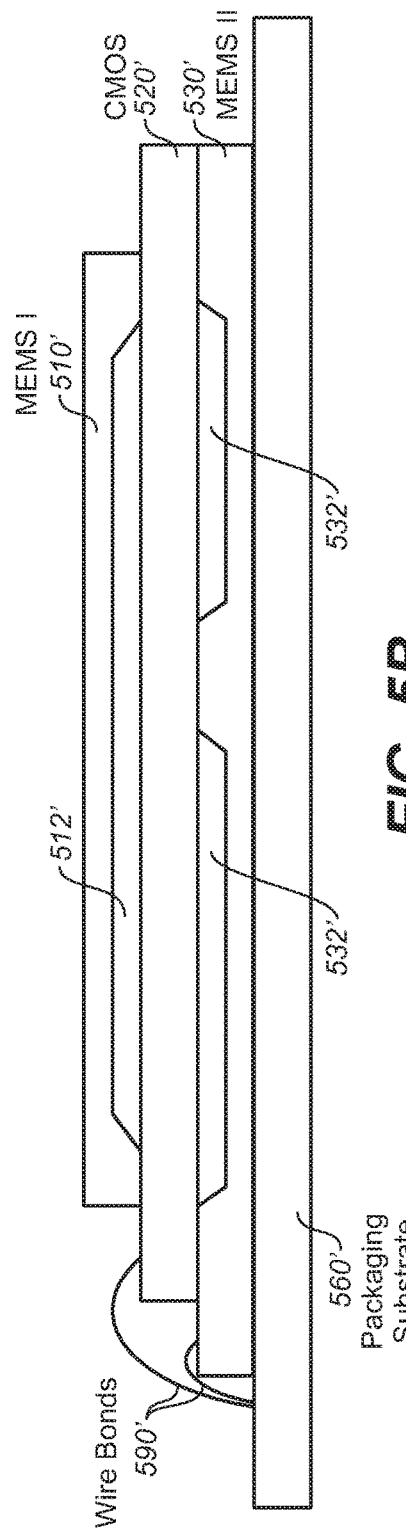
FIG. 5b illustrates a fifth MEMS-CMOS-MEMS package in accordance with an embodiment.

FIG. 5b illustrates a sixth MEMS-CMOS-MEMS package in accordance with an embodiment. In this embodiment, the MEMS 510' and 530' and CMOS 520' are electrically connected to each other and to the packaging substrate 560'. The MEMS I and MEMS II may each contain MEMS sensors, including but not limited to accelerometers, gyroscopes, etc. In this embodiment as shown, the electrical connections are formed using a combination of wire bonds 590' and bond pads (not shown), solder bonding, or eutectic bonding. In an alternate embodiment, a combination of wire bonds, TSVs, solder bonding or eutectic bonding may be used. The last layer of metal deposited in the conventional CMOS metallization process is suitable for use as a bond metal. The cavity 532', on the side of the MEMS II 530' facing the CMOS 520', which may contain MEMS sensors, also provides stress isolation between the MEMS II 530' and the CMOS 520'.

Figure 6:
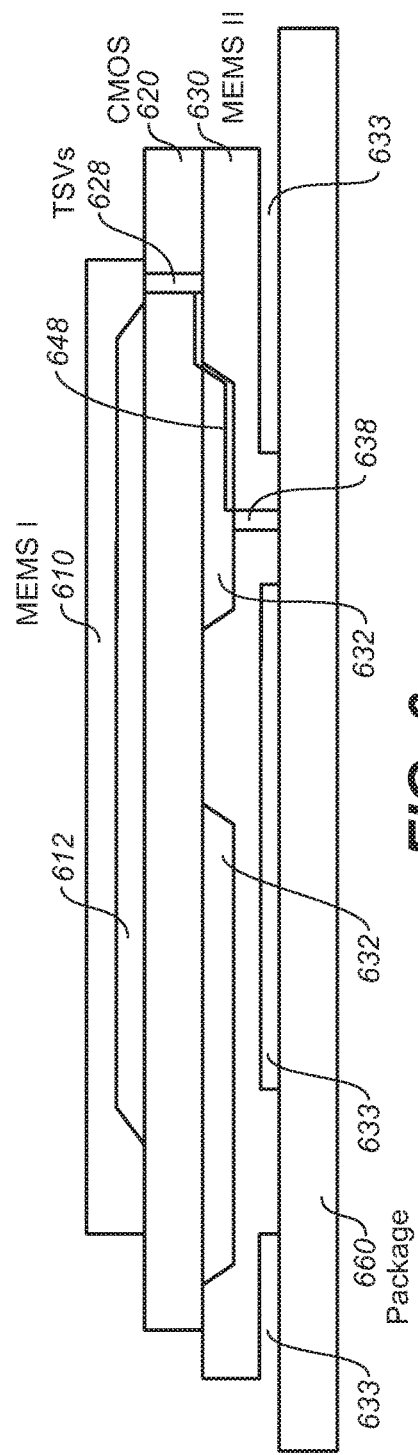
FIG. 6 illustrates a sixth MEMS-CMOS-MEMS package in accordance with an embodiment.

FIG. 6 illustrates a seventh MEMS-CMOS-MEMS package in accordance with an embodiment. MEMS I 610, CMOS 620 and MEMS II 630 are electrically connected to each other and to the packaging substrate. In this embodiment as shown, the electrical connections are formed using TSVs 628 in CMOS 620, TSVs 638 in MEMS II 630, and electrical connection 648. In an alternate embodiment, the electrical connection may be formed using a combination of solder bonding, eutectic bonding, or wire bonds. The second MEMS, MEMS II 630, functions as a stress-isolating platform (interposer) for the CMOS 620 and the first MEMS, MEMS I 610. The stress-isolating platform, MEMS II 630 is patterned so as to create vias 638 to provide electrical contact with the CMOS substrate. The interposer or MEMS II 630 has cavities 633 etched into the surface contacting the packaging substrate 660, in order to reduce the contact area and stress transmitted from the packaging substrate 660. In addition, the cavity 632, on the side of the MEMS II 630 facing the CMOS 620, which may contain MEMS sensors, also provides stress isolation between the MEMS II 630 and the CMOS 620.

Figure 7:
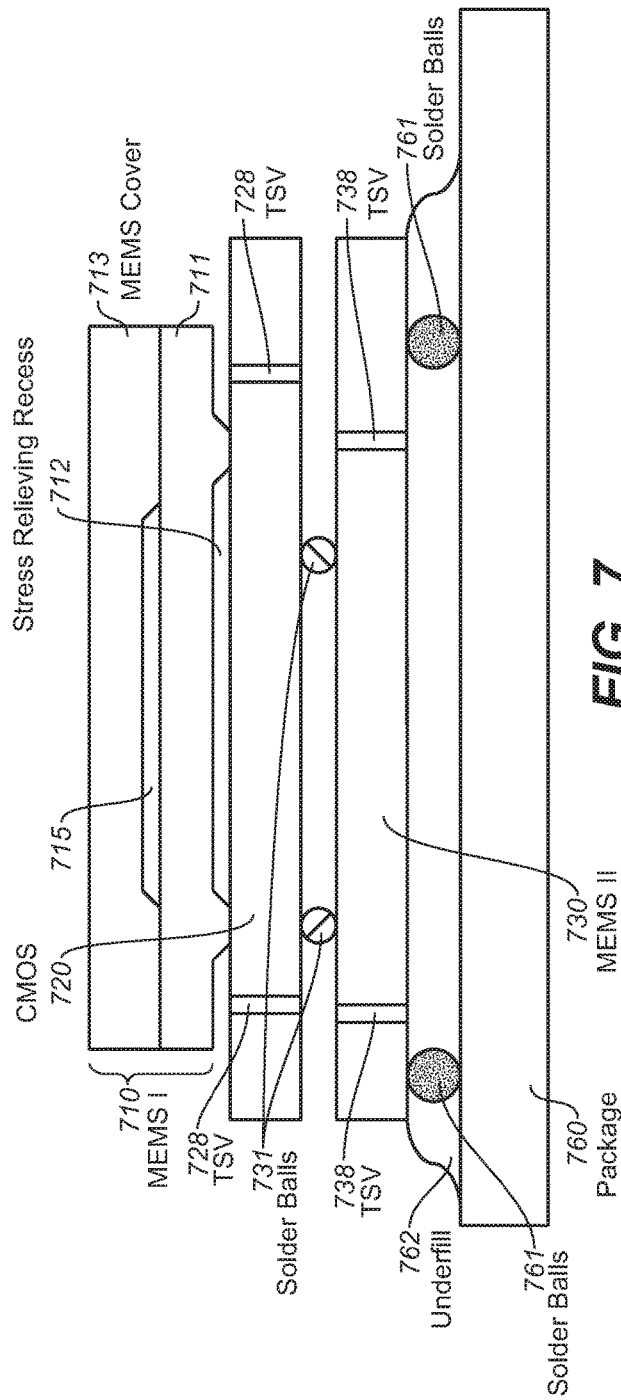
FIG. 7 illustrates a seventh MEMS-CMOS-MEMS package in accordance with an embodiment.

FIG. 7 illustrates an eighth MEMS-CMOS-MEMS package in accordance with an embodiment using flip-chip technology. The MEMS I substrate 710 comprises a handle substrate or a MEMS cover 713 with etched cavities 715 connected to a silicon device layer 711. The MEMS substrate 710 and the CMOS 720 are connected to each other. The MEMS-CMOS assembly thus formed is in turn connected to another MEMS, MEMS II 730 on a package 760, for example, a printed circuit board (PCB), via solder bonds 761. The solder balls 761 may, for example, be supported by underfill 762. The electrical connections between MEMS I 710, CMOS 720 and MEMS II 730 are formed using TSVs 728 in CMOS 720 as well as TSVs 738 in MEMS II 730.

Figure 8:
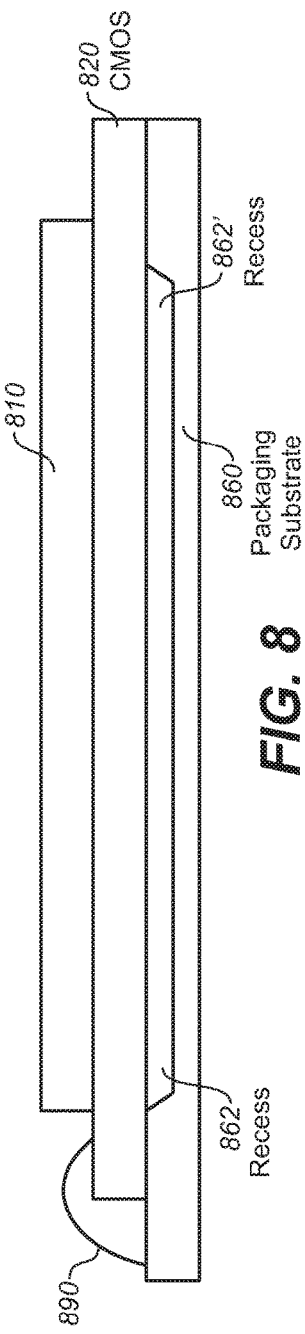
FIG. 8 illustrates a ninth MEMS-CMOS package 800 with a recesses 862 etched into the packaging substrate for stress-relieving purposes in accordance with an embodiment.

FIG. 8 illustrates a ninth MEMS-CMOS package 800 with a recesses 862 etched into the packaging substrate for stress-relieving purposes in accordance with an embodiment. The MEMS-CMOS package 800 contains a MEMS substrate 810 mechanically connected to a CMOS substrate 120, where electrical connections between the CMOS substrate 820 and packaging substrate 860 are provided by wire bonds 890 and bond pads (not shown). Also shown is the recesses 862 in the CMOS substrate 820 to provide stress isolation where the CMOS pivots about two contact points.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the present invention.

What is claimed is:

1. A package comprising:
   a sensor chip comprising:
   a first MEMS substrate;
   a CMOS substrate with a first surface and a second surface, wherein the first MEMS substrate is attached to the first surface of the CMOS substrate, and
   a second MEMS substrate with a first surface and a second surface; wherein the first surface of the second MEMS substrate is attached to the second surface of the CMOS substrate and the second surface of the second MEMS substrate is attached to a packaging substrate, the second MEMS substrate comprising a first cavity within the first surface of the second MEMS substrate and a second cavity within the second surface of the second MEMS substrate;
   wherein the first MEMS substrate, the CMOS substrate, the second MEMS substrate and the packaging substrate are connected through electrical interconnects.

2. The package of claim 1, wherein the second MEMS substrate further comprises a handle substrate and an attached device layer.

3. The package of claim 2, wherein the device layer comprises a moveable structure.

4. The package of claim 1, wherein the first MEMS substrate further comprises a cavity.

5. The package of claim 4, wherein the cavity is a recess on a surface attached to the CMOS substrate.

6. The package of claim 5, wherein the cavity of the first MEMS substrate is configured to receive a MEMS sensor and to provide stress isolation between the CMOS substrate and the first MEMS substrate.

7. The package of claim 1, wherein the first MEMS substrate further comprises a handle substrate and an attached device layer.

8. The package of claim 7, wherein the device layer comprises a moveable structure.

9. The package of claim 1, wherein the CMOS substrate further comprises an interconnect layer on the first surface.

10. The package of claim 9, wherein the interconnect layer comprises any of electrically conductive metal and semiconductor material.

11. The package of claim 1, wherein the CMOS substrate further comprises an electrical interconnect layer on the second surface.

12. The package of claim 11, wherein the electrical interconnect layer comprises any of electrically conductive metal and semiconductor material.

13. The package of claim 1, wherein the electrical interconnects further comprise any one of through-silicon via, solder bond, eutectic bond, wire bond and a combination thereof.

14. The package of claim 1, wherein the first MEMS substrate and the CMOS substrate, the CMOS substrate and the second MEMS substrate, and the second MEMS substrate and the packaging substrate are attached through a mechanical connection.

15. The package of claim 14 wherein the mechanical connection further comprises any of eutectic bonding, fusion bonding, solder bonding, low stress adhesive material and a combination thereof.

16. The package of claim 1, wherein the second MEMS substrate further comprises any of a blank substrate, a patterned non-active silicon substrate, a substrate containing a MEMS structure and a combination thereof.

17. The package of claim 1, wherein the second MEMS substrate comprises CMOS circuits.

18. The package of claim 1, wherein the first cavity is configured to receive a MEMS sensor and to provide stress isolation between the CMOS substrate and the second MEMS substrate.

19. The package of claim 18, wherein the second MEMS substrate further comprises a third cavity within the first surface of the second MEMS substrate, wherein the third cavity is configured to receive a second MEMS sensor and to provide stress isolation between the CMOS substrate and the second MEMS substrate.

20. The package of claim 1, wherein the second cavity is configured to provide stress isolation between the packaging substrate and the second MEMS substrate.

21. The package of claim 20, wherein the second MEMS substrate further comprises a third cavity within the second surface of the second MEMS substrate, wherein the third cavity is configured to provide stress isolation between the packaging substrate and the second MEMS substrate.

* * * * *